United States Patent [19]

Zimmermann

[11] Patent Number: 5,465,419
[45] Date of Patent: Nov. 7, 1995

[54] ARRANGEMENT FOR FREQUENCY CONVERSION OF AN INPUT SIGNAL WITH AN OSCILLATOR SIGNAL TO FORM AN INTERMEDIATE FREQUENCY SIGNAL

[75] Inventor: Walter Zimmermann, Dorfen, Germany

[73] Assignee: Siemens Aktiengesellschaft, Munich, Germany

[21] Appl. No.: 118,225

[22] Filed: Sep. 9, 1993

[30] Foreign Application Priority Data

Sep. 30, 1992 [EP] European Pat. Off. .............. 92116745

[51] Int. Cl.$^6$ .................................................. H04B 1/28
[52] U.S. Cl. .......................... 455/333; 455/318; 455/325
[58] Field of Search ..................................... 455/311, 313,
455/317, 318, 319, 325, 326, 327, 333,
332, 321, 322, 323, 324, 308; 328/158;
332/149, 144, 141; 307/529

[56] References Cited

U.S. PATENT DOCUMENTS

| | | | |
|---|---|---|---|
| 4,327,445 | 4/1982 | Tanaka | 455/333 |
| 4,490,854 | 12/1984 | Bensussan et al. | 455/118 |
| 5,001,776 | 3/1991 | Clark | 455/308 |
| 5,083,050 | 1/1992 | Vasile | 455/333 |

FOREIGN PATENT DOCUMENTS

| | | | |
|---|---|---|---|
| 0087336A1 | 8/1983 | European Pat. Off. | H03D 7/12 |
| 0203905A3 | 12/1986 | European Pat. Off. | H03D 7/12 |

OTHER PUBLICATIONS

Patent Abstracts of Japan, Apr. 16, 1987, vol. 11, No. 112, Toshiki Miyasaka "Single Mixer".
Shiga et al, "MMIC Family for DBS Downconverter with Pulse-Doped GaAs MESFETs" (IEEE), Oct. 1991, pp. 139–142.

Primary Examiner—Reinhard J. Eisenzopf
Assistant Examiner—Nguyen Vo
Attorney, Agent, or Firm—Hill, Steadman & Simpson

[57] ABSTRACT

An arrangement for frequency conversion of an input signal having a frequency $f_1$ with an oscillator signal having a frequency $f_2$ to form an intermediate frequency signal of frequency $f_3$ has a high intermodulation steadiness given a simultaneously low power consumption. A switch element is switched high-impedance and low-impedance parallel to a signal-carrying path with a control source having the oscillator frequency $f_2$. Circuits are inserted into the signal infeed and signal outfeed paths and have transmission properties for the frequency $f_1$ and blockage properties for the frequency $f_3$ in the infeed path, as well as transmission for the frequency $f_3$ and blockage for the frequency $f_1$ in the outfeed path.

4 Claims, 1 Drawing Sheet

ARRANGEMENT FOR FREQUENCY CONVERSION OF AN INPUT SIGNAL WITH AN OSCILLATOR SIGNAL TO FORM AN INTERMEDIATE FREQUENCY SIGNAL

BACKGROUND OF THE INVENTION

The invention is directed to an arrangement for frequency conversion of an input signal having the frequency $f_1$ with an oscillator signal having the frequency $f_2$ to form an intermediate frequency signal $f_3$.

In such arrangements an input signal is generally controlled with an oscillator signal via a non-linear characteristic such that the desired intermediate frequency signal arises, among other things, as a mixed result. There are a number of arrangements or mixer principles that accomplish this.

SUMMARY OF THE INVENTION

An object of the invention is to create an arrangement for frequency conversion of the type discussed above having high intermodulation steadiness given a low power consumption at the same time.

According to the invention, an arrangement is provided for frequency conversion of an input signal having a frequency $f_1$ with an oscillator signal having a frequency $f_2$ to form an intermediate frequency signal $f_3$. A switch element which switches between a high-impedance and a low-impedance state is connected parallel to a signal carrying path fed by a control source with the oscillator frequency $f_2$. A circuit is inserted into the signal infeed path having the properties of transmission for the frequency $f_1$ and blockage of the frequency $f_3$. A circuit is inserted in the signal outfeed path having the properties of transmission for the frequency $f_3$ and blockage for the frequency $f_1$.

Advantages obtainable with the invention are as follows. An extremely high intermodulation steadiness of the overall arrangement is achieved. The input signal terminal and intermediate frequency signal terminal are low-impedance (50 Ohms through 100 Ohms) and asymmetrical. A low power consumption of the arrangement is provided, for example, lying at only 300 mW. Moreover, a large admissible range of operating voltage of approximately 2.5 V through 7 V and large, allowable L.O. (local oscillator) level range are achieved for optimum operation. The great stability of the arrangement is a further advantage, i.e. a tendency to oscillate does not arise. In addition, the passive switch mixing stage is distinguished by low mixing losses. The arrangement has an extremely high mixing efficiency. The mixer principle can be applied for frequencies from the low-frequency range up into the high GHz range. The mixer is low-noise. The mixer can be wired with amplifiers, i.e. trans-impedance amplifiers, at the input and/or output without problems and with low reactance.

The invention shall be set forth in greater detail below with reference to an exemplary embodiment shown in the figures of the drawing.

DESCRIPTION OF THE PREFERRED EMBODIMENTS

Figure 1:
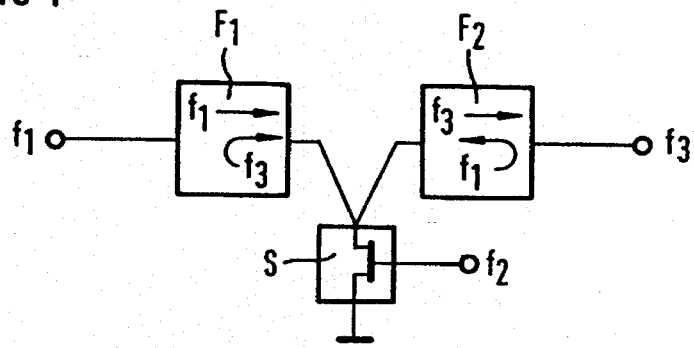
FIG. 1 is a schematic illustration of the circuit arrangement of the invention.

FIG. 1 shows a function of the mixer of the arrangement. The mixing of an input signal or of a supplied useful signal having the frequency $f_1$ with an oscillator signal having the frequency $f_2$ thereby occurs into a desired frequency $f_3=|f_1+f_2|$ or $f_3=|f_1-f_2|$ that is referred to as an intermediate frequency. The frequencies thereby also stand for frequency bands. A switch element S, preferably a field effect transistor but, for example, a diode, etc. as well, is switched high-impedance and low-impedance parallel to the signal-carrying path with a control source having the oscillator frequency $f_2$. A respective, frequency-selective circuit $F_2$ and $F_2$ having the following properties is thereby inserted into the signal-carrying path and into the signal-delivering part of the signal-carrying path: transmissive for $f_1$ and blocking for $f_3$ in the infeed path; and transmissive for $f_3$ and blocking for $f_1$ in the outfeeding path. The blocking in the circuits $F_1$ and $F_2$ expediently designed as filters occurs in high-impedance reflective fashion in the direction to the switch element S and is symbolized by a reversing arrow in FIG. 1.

Figure 2:
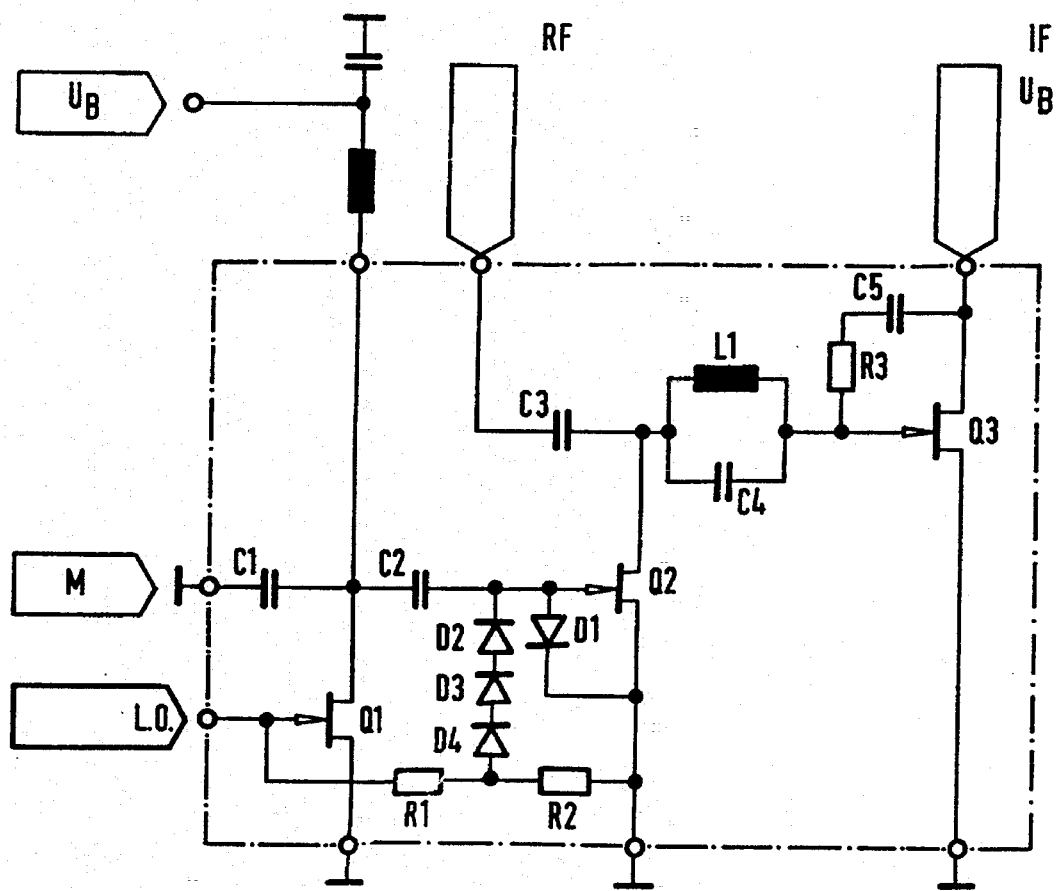
FIG. 2 is a circuit example of the arrangement of the invention.

The overall circuit of the arrangement for frequency conversion shown in FIG. 2 comprises a mixer, a controlled L.O. driver amplifier, and an intermediate frequency amplifier that are preferably monolithically integrated in a semiconductor substrate. For example, the circuit is designed for a frequency conversion of a radio-frequency signal RF having approximately 1.2 GHz into an IF position up to 200 MHz given a mixing gain of G>10 dB, a mixing noise F (SSB)<8 dB and an intermodulation steadiness dIM>60 dBc at Pin=2×−15 dBm. Given this circuit, the L.O. level that is supplied can lie between −10 dBm and +13 dBM (factor 200) without the function being deteriorated to a noteworthy extent. Given a typical power supply of $U_B$=5 V, the power consumption amounts to approximately 300 mW. The operating voltage $U_B$ in this circuit can fluctuate in a broad range between 2.5 V and 7 V. The obtainable intermodulation spacing of this mixer is better by a factor 100 to 1000 than previously known MMIC mixers for consumer electronics.

The mixer is composed of the passive mixer transistor Q2 (working without operating current) and the frequency filters. The high-pass filter C3 is located in the RF path as a signal infeed path and the inductance L1 and the capacitor C4 are located in the signal outfeed or IF path as a band elimination filter. The diode D1 protects the gate of the field effect transistor (mixer transistor Q2) against excessively high current densities in the conducting direction.

The L.O. driver amplifier is composed of the transistor Q1 whose high gain with a great steepness is achieved by a great gate width. The amplified L.O. signal controls the gate of the mixer transistor Q2 via C2 (switch mode).

The sum of the capacitive loads at the drain of the transistor Q2 is compensated with an external inductor L which takes the inductance of the housing terminal into consideration. The capacitor C1 optionally connectable to the ground M serves the purpose of lowering the external inductance L.

The limiter and control circuit composed of the diodes D2, D3, D4 and of the resistors R2, R1 limits the L.O. signal amplified with the transistor Q1 on the one hand, on the other hand, the negative voltage at the resistor R2 thus likewise generated regulates the gate of the transistor Q1 down via the resistor R1 to such an extent that the gate of the mixer transistor Q2 is optimally driven over a broad L.O. level range, and a minimization of the current consumption of the overall circuit is achieved at the same time.

The IF amplifier is composed of a transistor Q3 that is resistively fed back with the resistor R3 in order to keep the input and output low-impedance (75 Ohms through 100 Ohms). The integrated DC separating capacitor C5 can be enlarged by an optional, external capacitor, such that the low-impedance input into the IF amplifier can be expanded in the direction toward lower frequencies.

Although various minor changes and modifications might be suggested by those skilled in the art, it will be understood that I wish to include within the scope of the patent warranted herein all such changes and modifications as reasonably come within my contribution to the art.

I claim as my invention:

1. An arrangement for frequency conversion of an input signal having a frequency $f_1$ with a local oscillator signal having a frequency $f_2$ to form an intermediate frequency signal having a frequency $f_3$, comprising:

a signal carrying path having an input path and an output path;

a control source for generating said local oscillator signal with the oscillator frequency $f_2$;

a local oscillator driver amplifier comprising a transistor;

a first circuit inserted into said input path and having properties of transmission for the frequency $f_1$ and rejection for the frequency $f_3$;

a second circuit inserted into said output path having properties of transmission for the frequency $f_3$ and rejection for the frequency $f_1$;

a switch element arranged between a junction between said first and second circuits to ground;

said switch element being switched between a high-impedance and a low-impedance state with said frequency $f_2$ of the oscillator signal;

an IF amplifier comprising a resistor fed-back transistor provided in said output path;

a limiter and control circuit;

said control source being connected to said switch element via said local oscillator driver amplifier and said limiter and control circuit;

said local oscillator driver amplifier amplifying said local oscillator signal and controlling the switch element at a control input thereof via a capacitor; and said limiter and control circuit limiting an amplified local oscillator signal amplified with said local oscillator driver amplifier and being connected to regulate a gate of said local oscillator drive amplifier so that said control input of said switch element is optimally driven and a current consumption of the frequency conversion arrangement is minimized.

2. An arrangement according to claim 1 wherein said first circuit comprises a high pass filter and said second circuit comprises a band elimination filter for the frequency $f_1$.

3. An arrangement according to claim 1 wherein the arrangement is monolithically integrated on a semiconductor substrate.

4. An arrangement for frequency conversion, comprising:

an input having an input signal of frequency $f_1$ thereat;

a local oscillator providing a local oscillator signal having a frequency $f_2$;

an output terminal having an intermediate frequency signal with a frequency $f_3$;

said input signal being connected to a first filter for allowing said frequency $f_1$ to pass and for reflectively blocking the frequency $f_3$;

said output terminal being connected to an output of an output filter which allows said frequency $f_3$ to pass and which reflectively blocks said frequency $f_1$;

an output of said first filter and an input of said output filter being directly connected together at a junction;

at said junction a field effect transistor source/drain path being connected to ground;

said field effect transistor being switched between a high impedance and a low impedance state with said frequency $f_2$ of the oscillator signal;

a local oscillator driver amplifier comprising a transistor;

a limiter and control circuit comprising a series arrangement of at least one diode and a first resistor, said series arrangement being connected between a gate and a source of said field effect transistor, and comprising a second resistor being connected between an input of said local oscillator driver amplifier transistor and a junction between said first resistor and said at least one diode;

said local oscillator being connected to an input of said field effect transistor via said local oscillator driver amplifier and said limiter and control circuit;

said local oscillator driver amplifier amplifying said oscillator signal and controlling the field effect transistor at the input thereof via a capacitor; and said limiter and control circuit limiting an amplified local oscillator signal amplified with said local oscillator driver amplifier and being connected to regulate a gate of said local oscillator drive amplifier so that said control input of said field effect transistor is optimally driven and a current consumption of the frequency conversion arrangement is minimized.

* * * * *